United States Patent
Abel et al.

(10) Patent No.: US 8,014,541 B1
(45) Date of Patent: Sep. 6, 2011

(54) METHOD AND SYSTEM FOR AUDIO FILTERING

(75) Inventors: Jonathan S. Abel, Menlo Park, CA (US); David P. Berners, San Jose, CA (US)

(73) Assignee: Kind of Loud Technologies, LLC., Santa Cruz, CA (US)

( * ) Notice: Subject to any disclaimer, the term of this patent is extended or adjusted under 35 U.S.C. 154(b) by 1372 days.

(21) Appl. No.: 11/249,159

(22) Filed: Oct. 11, 2005

Related U.S. Application Data

(60) Provisional application No. 60/617,343, filed on Oct. 8, 2004.

(51) Int. Cl.
 *H03G 5/00* (2006.01)
(52) U.S. Cl. ........ 381/103; 381/106; 381/101; 381/102; 381/80; 381/94.3; 333/28 R; 375/229; 375/230; 708/322
(58) Field of Classification Search ............... 381/103, 381/106, 101, 102, 80, 94.3; 333/28 R; 375/229, 375/330; 708/322
See application file for complete search history.

(56) References Cited

U.S. PATENT DOCUMENTS

| | | | | |
|---|---|---|---|---|
| 6,236,731 | B1 * | 5/2001 | Brennan et al. | 381/316 |
| 6,581,080 | B1 * | 6/2003 | Richards | 708/320 |
| 2002/0033995 | A1 * | 3/2002 | Shimojoh et al. | 359/337.1 |
| 2004/0136554 | A1 * | 7/2004 | Kirkeby | 381/309 |
| 2005/0254564 | A1 * | 11/2005 | Tsutsui | 375/229 |

OTHER PUBLICATIONS

Azizi, Seyed-Ali, "A New Concept of Interference Compensation for Parametric and Graphic Equalizer Banks", *Audio Engineering Soc., Convention Paper 5482*, Sep. 21-24, 2001, New York, NY, pp. 1-8.
Azizi, Seyed-Ali, "A New Concept of Interference Compensation for Parametric and Graphic Equalizer Banks", *Audio Engineering Soc., Convention Paper 5629*, May 10-13, 2002, Munich, Germany, pp. 1-8.
Berners, David P., et al., "Discrete-Time Shelf Filter Design for Analog Modeling", *Audio Engineering Soc., Convention Paper*, Oct. 11-13, 2003, New York, NY, pp. 1-5.
Blesser, Barry A., et al., "Audio Dynamic Range Compression for Minimum Perceived Distortion", *IEEE Transactions on Audio and Electroacoustics*, vol. AU-17, No. 1, Mar. 1969, pp. 22-32.
Bohn, Dennis A., "Constant-Q Graphic Equalizers", *Audio Engineering Soc., Convention Paper 2265-D-15*, Oct. 12-16, 1985, New York, NY, pp. 1-42.
Deczky, Andrew G., "Unispherical Windows", *IEEE*, 2001, pp. II-85-II-88.
Floru, Fred, "Attack and Release Time Constraints in RMS-Based Feedback Compressors", *J. Audio Eng. Soc.*, vol. 47, No. 10, Oct. 1999, pp. 788-804.

(Continued)

*Primary Examiner* — Devona E Faulk
*Assistant Examiner* — Paul Kim
(74) *Attorney, Agent, or Firm* — Mark J. Danielson; Pillsbury Winthrop Shaw Pittman LLP

(57) ABSTRACT

A system and method for graphic equalization of audio signals is disclosed. Traditional graphic equalizers provide control over the gains in each of a set of frequency bands. However, the actual band gains vary from the desired gains due to crosstalk between bands. Prior art methods for addressing this difficulty include applying a correction filter to the equalizer, and adjusting the shape of the individual band filters, both of which increase the computational cost. In an embodiment of the present invention, the input gains are processed to produce a set of adjusted gains which take into account the crosstalk, and result in an equalization interpolating the input band gains.

14 Claims, 13 Drawing Sheets

OTHER PUBLICATIONS

Kraght, Paul, "Aliasing in Digital Clippers and Compressors", *J. Audio Eng. Soc.*, vol. 48, No. 11, Nov. 2000, pp. 1060-1065.

Lang, Mathias C., "Least-Squares Design of IIR Filters with Prescribed Magnitude and Phase Responses and a Pole Radius Constraint", *IEEE*, 2000, pp. 3109-3121.

Mapes-Riordan, Dan, "A Worst-Case Analysis for Analog Quality (Alias Free) Digital Dynamics Processing", *J. Audio Eng. Soc.*, vol. 47, No. 11, Nov. 1999, pp. 948-952.

McGrath, David, et al., "Raised Cosine Equalization Utilizing Log Scale Filter Synthesis", *Audio Engineering Soc., Convention Paper 6257*, Oct. 28-31, 2004, San Francisco, CA, pp. 1-16.

Olveira, A.J., "A Feedforward Side Chain Limiter/Compressor/De-esser with Improved Flexibility", *J. Audio Eng. Soc.*, vol. 37, No. 4, Apr. 1999, pp. 226-240.

Orfanidis, S. J., "Digital Parametric Equalizer Design with Prescribed Nyquist Frequency Gain", *J. Audio Eng. Soc.*, vol. 45, No. 6, Jun. 1997, pp. 444-455.

Tarczynski, A., et al., "A WISE Method for Designing IIR Filters", *IEEE Trans. on Signal Proc.*, 2001, vol. 49, No. 7, Jul. 2001, pp. 1421-1432.

\* cited by examiner

METHOD AND SYSTEM FOR AUDIO FILTERING

CROSS-REFERENCE TO RELATED APPLICATIONS

The present application is based on, and claims priority from, U.S. Provisional Appln. No. 60/617,343, filed Oct. 8, 2004, commonly owned by the present assignee, the contents of which are incorporated herein by reference. This application is also related to commonly-owned and concurrently-filed U.S. application Ser. No. 11/249,162, the contents thereof also being incorporated herein by reference.

FIELD OF THE INVENTION

This invention pertains to the field of digital signal processing, and in particular to equalization and filtering, especially of audio signals.

BACKGROUND OF THE INVENTION

In the recording, production and playback of audio, one important and widely used tool is equalization, the manipulation of signal level and phase as a function of frequency. Equalization may be used to correct problems in a recorded signal and for artistic purposes. Different genres of music can have characteristic power spectra, and equalization may be applied to program material so as to achieve the expected long-term power spectrum. In playback of audio, equalization may be used to compensate for resonances of a performance or listening space.

A common equalizer used for live sound and consumer playback is a so-called graphic equalizer, in which control is provided over the gain in each of a set of frequency bands. In a traditional graphic equalizer for audio shown in FIG. 1, the transfer function is controlled by specifying the gains for each of a set of cascaded shelving and peaking filters 104, 105 . . . 106, 107. See, e.g., Dennis A. Bohn, "Constant-Q graphic equalizers," *Journal of the Audio Engineering Society*, 34:611-626, 1986. While it is desired that the transfer function magnitude smoothly interpolate the given gains, this is not always the case. As seen in the example of FIG. 3, if the filter bandwidths are small, the equalizer transfer function will exhibit ripples 302, tending towards unity gain at frequencies between the band centers. In the figure, the transfer function magnitudes of a set of peaking and shelving filters comprising the bands of a graphic equalizer are shown as dashed lines along with the transfer function magnitude of their cascade 302. The peaking and shelving filter gains are set according to input gains, shown as 'o' marks. On the other hand, as shown in FIG. 2, if the component filter bandwidths are sufficiently broad that the transfer function magnitude is smooth, the transfer function will often overshoot the desired gain due to contributions from adjacent bands.

This difficulty is well known, and in Justin Baird, Bruce Jackson and David McGrath, "Raised Cosine Equalization Utilizing Log Scale Filter Synthesis," *Audio Engineering Society* 115th *Convention*, preprint 6257, San Francisco Calif., October 2004, Baird, et al. proposed making the band filters so-called mesa filters, rather than second-order sections, as is typical. Mesa filters have a prescribed band gain, crossfading to a gain of one outside the band. The crossfade approximates a raised cosine on a log-magnitude scale, and, as such, adjacent bands may be independently moved, with the system transfer function smoothly interpolating the band gains. The drawback is that the mesa filters are each made of seven parametric sections, and are costly to implement.

In another prior art approach proposed by Azizi (see Seyed-Ali Azizi, "A New Concept of Interference Compensation for Parametric and Graphic Equalizer Banks," *Audio Engineering Society* 111th *Convention*, preprint 5482, New York N.Y., September 2001 and Seyed-Ali Azizi, "A New Concept of Interference Compensation for Parametric and Graphic Equalizer Banks," *Audio Engineering Society* 111th *Convention*, preprint 5629, Munich Germany, May 2002), a correction filter 404 is added to the output of the equalizer, as shown in FIG. 4. The idea is that the correction filter is adjusted so that the cascade of the standard equalizer and correction approximately interpolates the desired band gains. Again the drawback is increased computational cost.

Another prior art method proposed by Azizi in the cited references is a filter design method, where the parameters describing the center frequencies, bandwidths and gains are adjusted in an iterative constrained nonlinear optimization process so as to achieve the desired band gains. Drawbacks to this approach include the computational cost of the optimization which Azizi describes as not suitable for real-time use, and the more serious difficulty that the iteration might get stuck in a local minimum.

Other filter design methods, such as Prony or Hankel methods (see Julius O. Smith III, *Techniques for Digital Filter Design and System Identification with Application to the Violin*, Ph.D. thesis, Stanford University, 1983), can be used to closely match a given transfer function magnitude. They, however, are not easily adapted to psychoacoustically meaningful goodness-of-fit measures, which involve minimizing dB differences in transfer function magnitude over a Bark or ERB frequency scaling. Those methods that apply psychoacoustic measures in designing filters can be computationally cumbersome due to the nonlinear optimization involved.

In any event, these design approaches are generally not useful for applications such as HRTF filtering (see E. M. Wenzel, "Localization in virtual acoustic displays," *Presence*, 1:80-107, 1992), where the resulting filter needs to be slewed or interpolated between tabulated designs. The reason is that the poles and zeros maximizing a goodness-of-fit rarely can be related to particular features in the desired transfer function magnitude. As a result, there is often no clear way to process sets of tabulated filter coefficients that leads to a meaningful filter intermediate between table entries.

There remains a need in the art, therefore, to develop a graphic equalizer which interpolates the prescribed band gains, is computationally efficient to implement, and is parameterized in such a way that it may be interpolated or slewed between tabulated designs.

SUMMARY OF THE INVENTION

A system and method according to the invention enables providing a graphic equalizer with desired attributes. According to one aspect, the present invention modifies the input gains so as to account for the interference between adjacent bands. By adjusting the filter gains, the equalizer transfer function can be made to interpolate the desired band gains. In one embodiment of the present invention, the band gains and transition frequencies are used to compute a set of filter gains. The filter gains are then used to design the peaking and shelving filters which are cascaded to equalize the input signal. In another embodiment of the present invention, a set of band frequencies is specified, and a matrix computed. The filter gains are then formed as the product of the pre-computed matrix and the input gains. In another embodiment of the present invention, a set of shelf filters pre-filters the input before being sent to a cascade of peak and shelf sections. The cascade simply accounts for any deviations of the shelf filter set from the desired transfer function magnitude. Yet another embodiment of the present invention filters an input signal by a cascade of peaking and shelving filters specified by interpolating tabulated transition frequencies and gains according to an input table index. Using second-order sections parameterized by transition frequency and gain, as described herein, tabulated filter designs may be slewed or interpolated simply by crossfading the corresponding gains and transition frequencies.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

Figure 1:
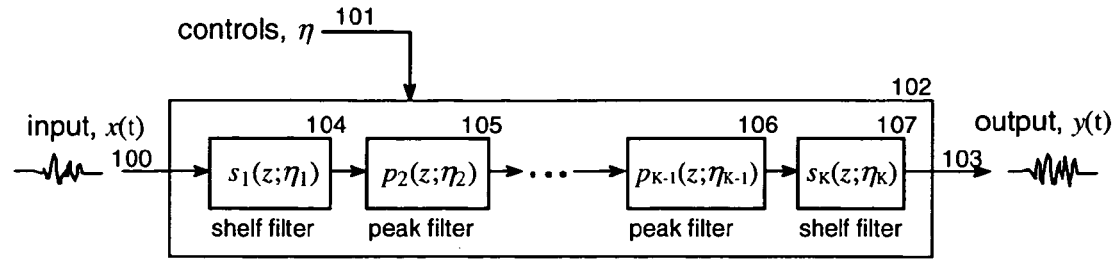
FIG. 1 illustrates a conventional system for graphic equalization, in which a set of input gains is used to design peaking and shelving filters, applied to the input signal in cascade.
Figure 2:
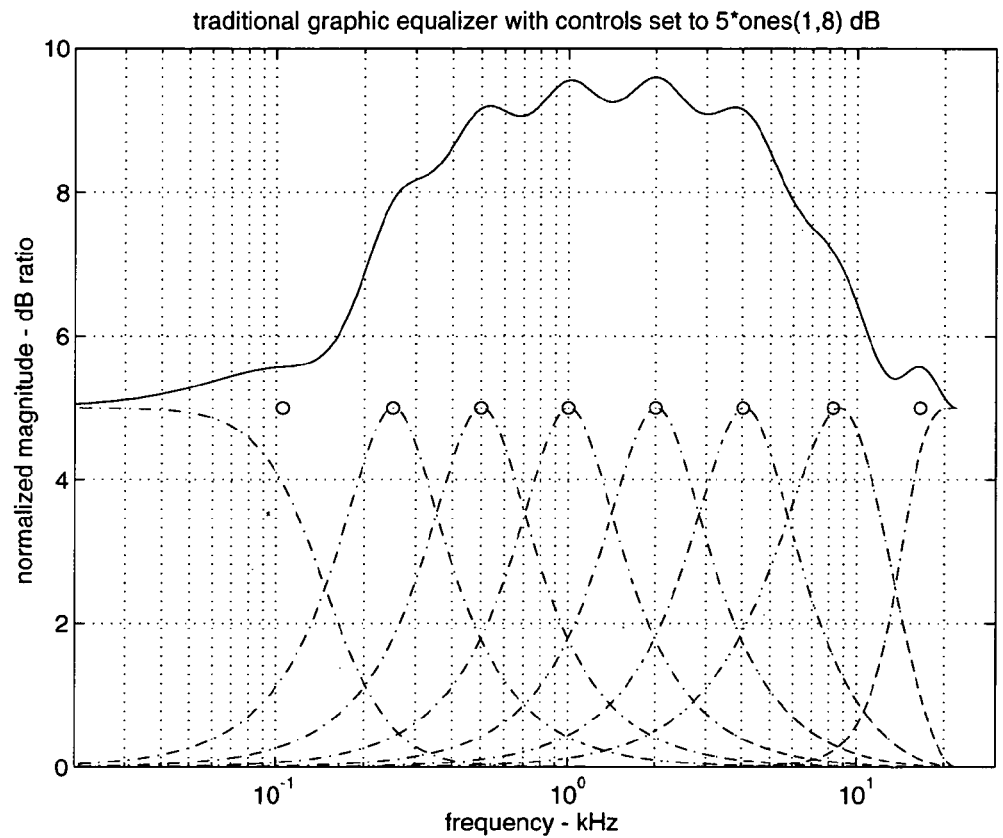
FIG. 2 is a graph illustrating an example of a prior art graphic equalizer transfer function.
Figure 3:
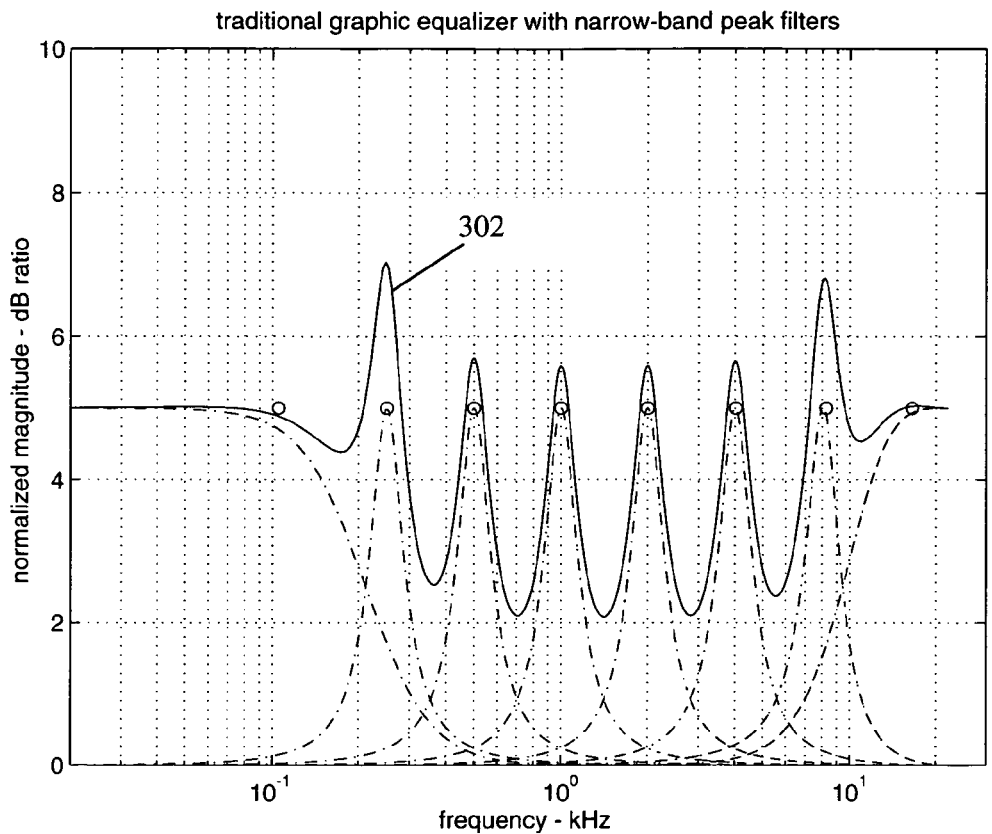
FIG. 3 is a graph illustrating another example of a prior art graphic equalizer transfer function.
Figure 4:
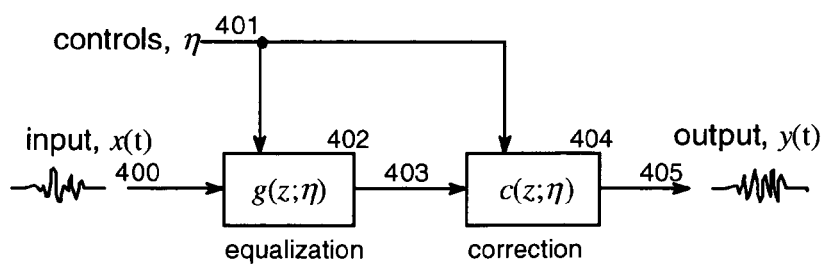
FIG. 4 illustrates another conventional system for graphic equalization.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The inventive methods described herein will be discussed with respect to digital filters configured as a cascade of second-order sections. Such filters can be used in graphic equalizers that are well known in the art. For example, many home and car audio systems have graphic equalizers that allow users to adjust power levels in a plurality of frequency bands for a desired effect during audio playback. The invention is not limited to this example, however.

It is understood, moreover, that the techniques discussed herein apply, with modifications that should be clear to those skilled in the art, to other digital and analog filter structures, such as lattice and ladder filters, other filter orders, and to any number of implementation platforms, such as signal processing microprocessors and other discrete time systems, as well as analog systems.

In general, the present invention recognizes that the construction of second-order peaking and shelving filters can be parameterized so that that, as a function of section gain, they possess approximately self-similar dB transfer-function magnitudes. This property enables the use of linear least-squares techniques to optimize the gains in a cascade of filter sections to match a desired dB transfer-function magnitude.

The basic approach of the present invention, therefore, is to modify the input gains using filters determined in accordance with the above recognition so as to account for the interference between adjacent bands. By adjusting the filter gains, the equalizer transfer function can be made to interpolate the desired band gains. This results in substantial improvement over the traditional approach of setting the filter gains to the input band gains, and adjusting filter bandwidth to trade between overshoot and ripple. It also adds no computational cost to the filtering.

The inventive approach is based on the further observation that second-order peaking and shelving filters can be made nearly self-similar on a log magnitude scale with respect to peak and shelf gain changes. By cascading such second-order sections, filters are formed which may be fit to dB magnitude characteristics via linear least-squares techniques. In some embodiments of the present invention, the filter gains are adjusted to match one point in each band; in other embodiments the fit is over an entire range of frequencies.

The approach of the present invention will now be described in more detail by first identifying certain features of peaking and shelving filters parameterized in certain ways.

The peak filter $p(\omega; \lambda, \phi_\pm)$ used here is characterized by a maximum gain $\lambda$, achieved somewhere between two transition frequencies $\phi_-$ and $\phi_+$, at which the gain is sqrt($\lambda$). The filter takes on a gain of one at DC and the band edge. The second-order infinite impulse response (IIR) digital filter $$\frac{b_0 + b_1 z^{-1} + b_2 z^{-2}}{1 + a_1 z^{-1} + a_2 z^{-2}} \tag{1}$$

with coefficients given by $$a_2 = \frac{2Q - \sin\varphi_c}{2Q + \sin\varphi_c}, \tag{2}$$

$$a_1 = b_1 = -(1 + a_2)\cos\varphi_c, \tag{3}$$

$$b_0 = \frac{1}{2}(1 + a_2) + \frac{1}{2}(1 - a_2)\lambda, \tag{4}$$

$$b_2 = \frac{1}{2}(1 + a_2) - \frac{1}{2}(1 - a_2)\lambda, \tag{5}$$

implements a peak (or notch) filter with maximum (or minimum) gain $\lambda$ at a center frequency $\phi_c$ between the specified transition frequencies $\phi_\pm$, at which the filter takes on magnitude sqrt($\lambda$). The center frequency $\phi_c$ and the inverse bandwidth Q may be written in terms of the transition frequencies $\phi_\pm$ and peak gain $\lambda$, $$\varphi_c = a\cos\left\{\kappa - \text{sign}\{\kappa\}(\kappa^2 - 1)^{\frac{1}{2}}\right\}, \tag{6}$$

$$\kappa = \frac{1 + \cos\varphi_- \cos\varphi_+}{\cos\varphi_- + \cos\varphi_+} \tag{7}$$

$$Q = \frac{1}{2}\left[\frac{\lambda \sin^2\varphi_c \cdot (\cos\varphi_- + \cos\varphi_+)}{2\cos\varphi_c - \cos\varphi_- - \cos\varphi_+}\right]^{\frac{1}{2}} \tag{8}$$

In the case that $\phi_+ + \phi_- = \pi$, we have $$\varphi_c = \pi/2, \tag{9}$$

$$Q = \frac{\sqrt{\lambda}}{2}|\cot\delta|, \quad \delta = \frac{1}{2}(\varphi_- - \varphi_+) \tag{10}$$

Figure 10:
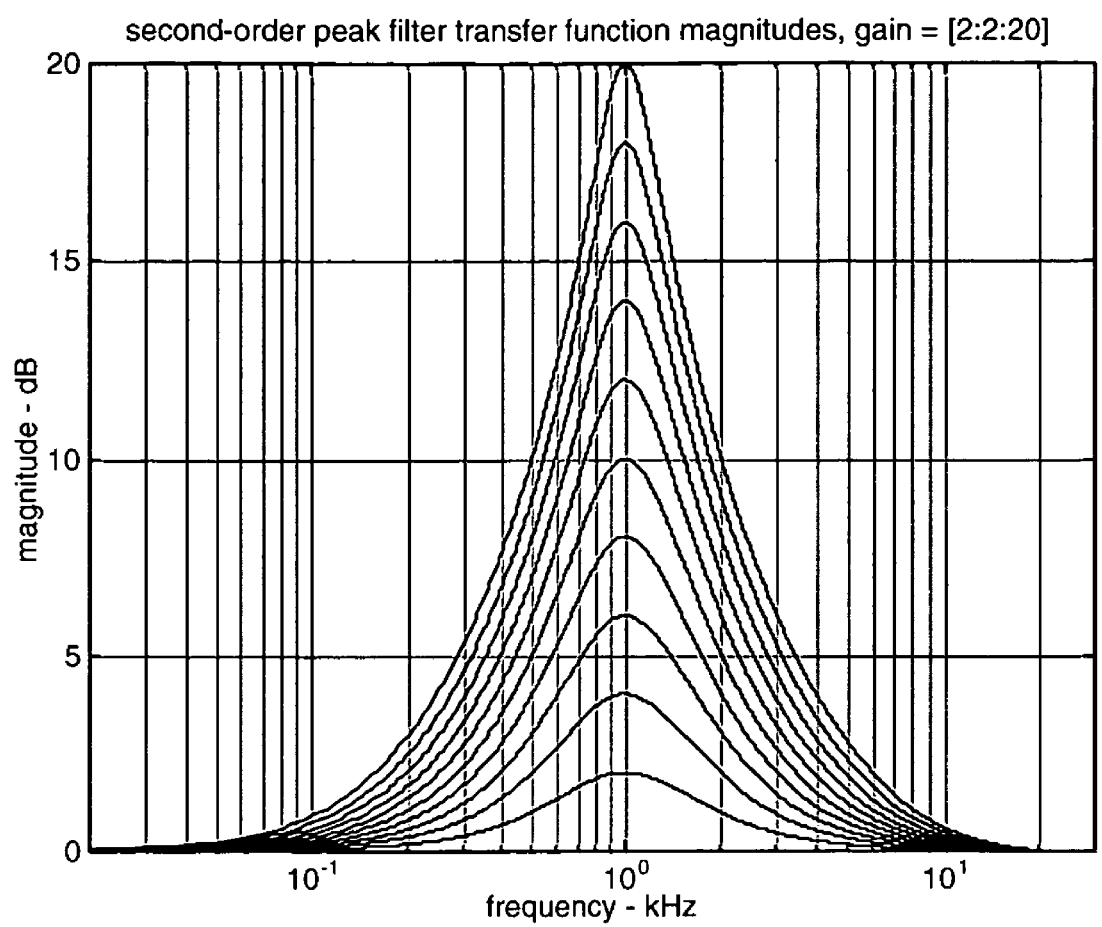
FIG. 10 is a graph illustrating an example peak filter transfer function.
Figure 11:
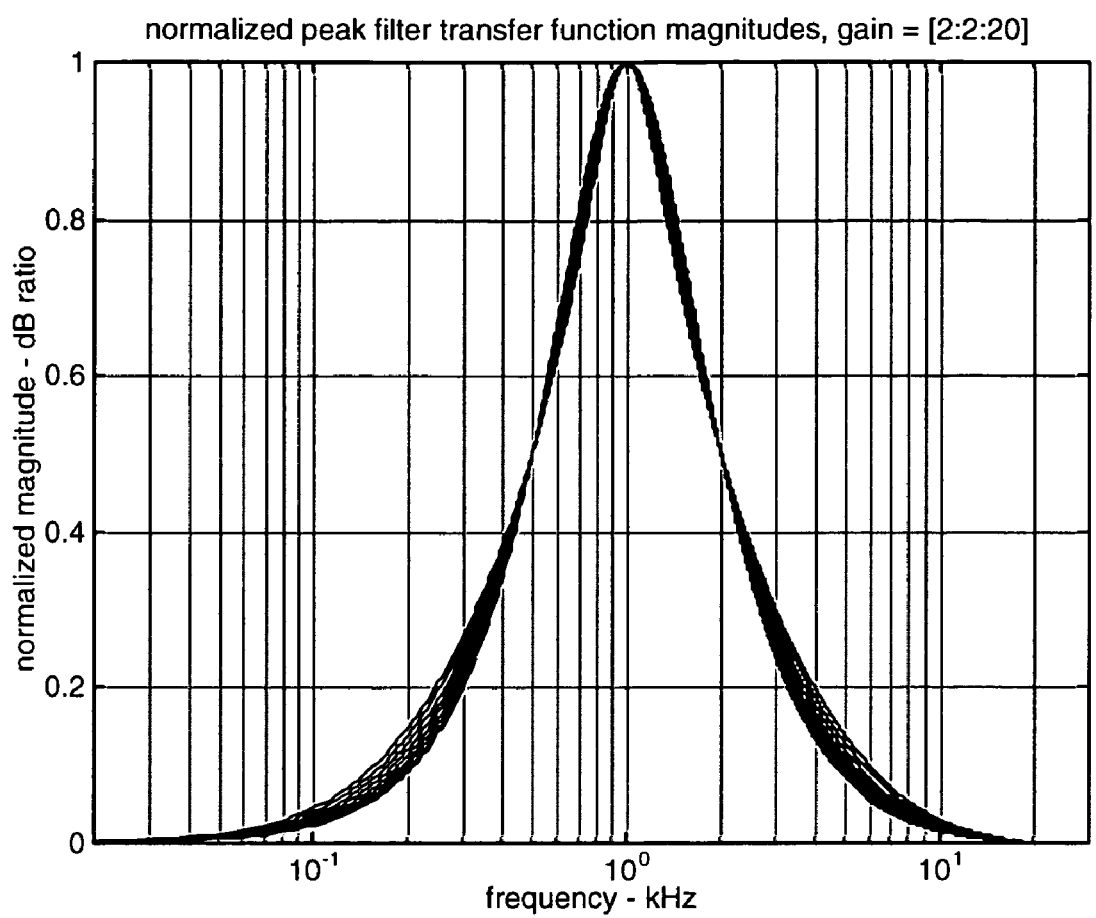
FIG. 11 is a graph illustrating another set of example peak filter transfer functions.

By parameterizing the peak filter in this way, note that it is approximately self similar on a log magnitude scale, as illustrated in FIGS. 10 and 11. Put differently, the scaled log magnitude transfer function approximates the log magnitude of the transfer function of the peak filter generated using a scaled gain:

$$\alpha \cdot \log|p(\omega; \lambda, \phi_\pm)| \approx \log|p(\omega; \lambda^\alpha, \phi_\pm)| \tag{11}$$

Figure 8:
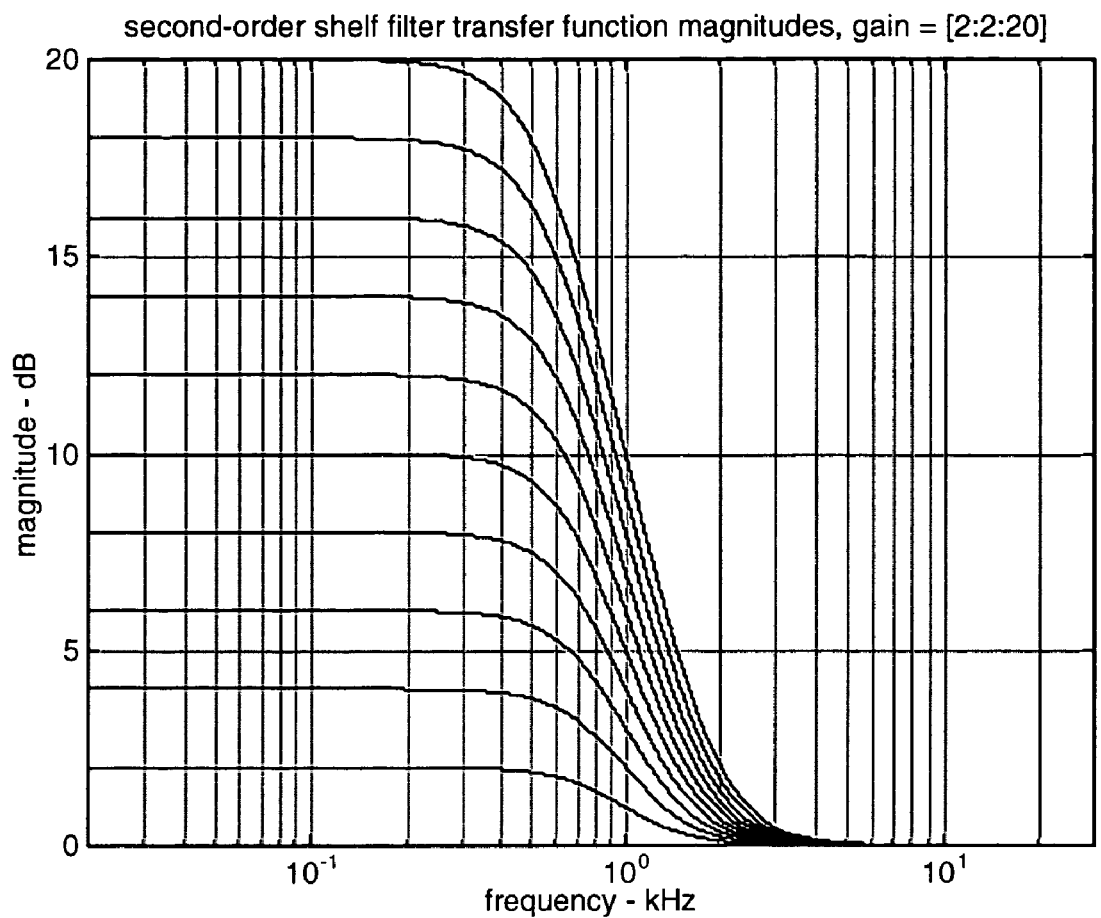
FIG. 8 is a graph illustrating an example set of shelf filter transfer function.
Figure 9:
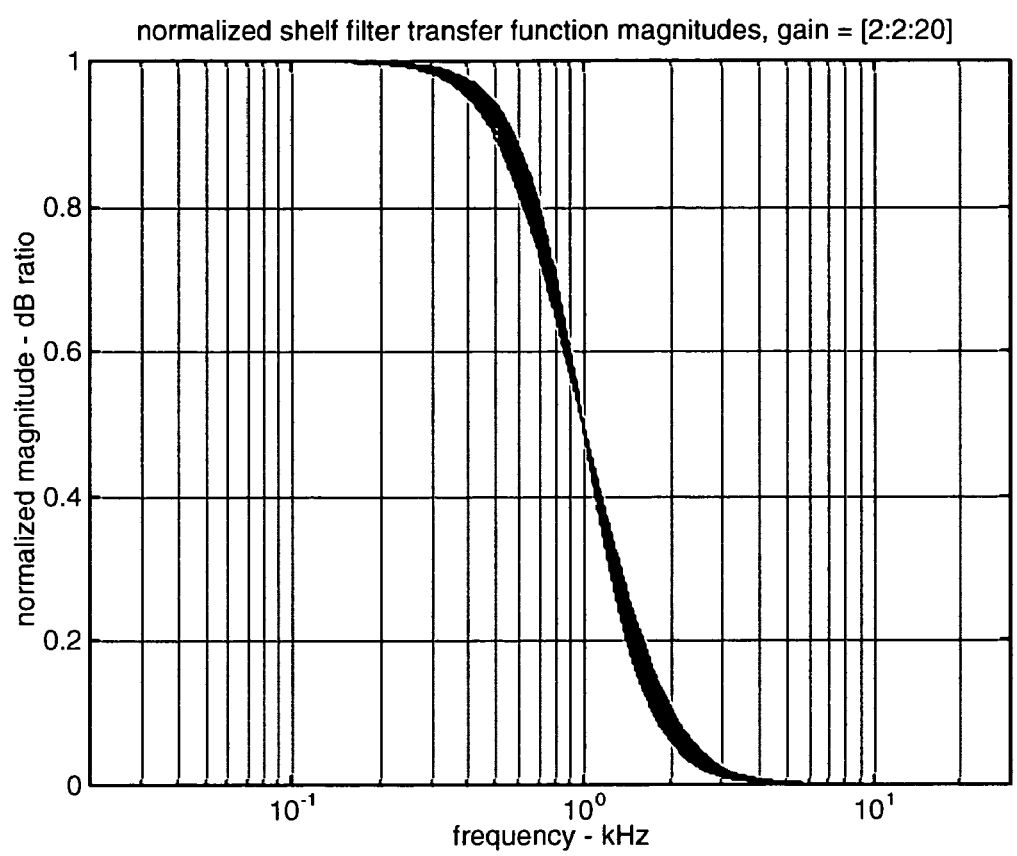
FIG. 9 is a graph illustrating another set of example shelf filter transfer functions.

Similarly, the low shelf filter $s(\omega, \lambda, \phi)$ takes on a gain $\lambda$ at DC, a gain of one at the band edge, and a gain sqrt($\lambda$) at the specified transition frequency $\phi$, as shown in FIG. 8. As seen in FIG. 9, the shelf filter also is approximately self similar.

$$\alpha \cdot \log|s(\omega; \lambda, \phi)| \approx \log|s(\omega; \lambda^\alpha, \phi)| \tag{12}$$

A high shelf filter taking on a gain $\lambda$ at the band edge, with a DC gain of one is easily generated, and shares the approximate self similarity with the peak filter described above.

The first-order digital filter $$\frac{b_0 + b_1 z^{-1}}{1 + a_1 z^{-1}} \tag{13}$$

with coefficients given by $$a_1 = (\rho + \alpha)/\alpha_0, \tag{14}$$

$$b_0 = \beta 0 + \rho \beta 1, \tag{15}$$

$$b_1 = \beta 1 + \rho \beta 0, \tag{16}$$

where $a_0 = 1 + \rho\alpha$, and $\rho = \sin(\phi/2 - \pi/4)/\sin(\phi/2 + \pi/4)$, and $$\beta_0 = (\lambda_0 + \lambda_\pi + \alpha(\lambda_0 - \lambda_\pi))/2, \tag{17}$$

$$\beta_1 = (\lambda_0 - \lambda_\pi + \alpha(\lambda_0 + \lambda_\pi))/2, \tag{18}$$

with $\alpha = 0$ if $\lambda_0 = \lambda_\pi$, and $$\eta = (\lambda_\pi + \lambda_0)/(\lambda_\pi - \lambda_0), \tag{19}$$

$$\alpha = \eta - \text{sign}(\eta) \cdot [\eta^2 - 1]^{\frac{1}{2}}, \tag{20}$$

otherwise, is a shelf filter with DC gain $\lambda_0$, band edge gain $\lambda_\pi$, and gain sqrt ($\lambda_0 \lambda_\pi$) at the transition frequency $\phi$.

A second-order shelf filter may be formed by cascading two first-order shelf filters, each with half the desired dB gains. Second-order shelf filters may also be formed according to David P. Berners and Jonathan S. Abel, "Discrete-time shelf filter design for analog modeling," *Audio Engineering Society* 115*th Convention,* preprint 5939, New York, October 2003, or any number of other methods well known to those skilled in the art.

Having identified the features above, various embodiments of the invention will now be described in more detail. In one embodiment of the present invention, shown in FIG. 15, the band gains and transition frequencies are used to compute a set of filter gains. The filter gains are then used to design the peaking and shelving filters which are cascaded to equalize the input signal. In particular, the self similarity of second-order peaking and shelving filters enables linear least-squares fitting of a cascade of such filters to a desired log magnitude transfer function.

Consider a cascade of K peak and shelf filters $g(\omega; \theta)$ having dB gains $\lambda_k$, k=1, ..., K and transition frequencies $\phi_k$, k=1, ..., K−1 stacked in the column $\theta$, $$g(\omega; \theta) = s(\omega; \lambda_1, \varphi_1) \cdot s(\omega; \lambda_K, \varphi K - 1) \cdot \prod_{k=2}^{K-1} p(\omega; \lambda_k, \varphi_{k-1}, \varphi_k) \tag{21}$$

Because of the self similarity property, the dB magnitude of the cascade, denoted $$\gamma(\omega; \theta) \stackrel{def}{=} 20\log_{10}\{g(\omega; \theta)\}, \tag{22}$$

is approximately linear in the filter gains. Stacking instances of $\gamma(\omega, \theta)$ evaluated at a set of frequencies $\omega_i$ to form the column $\gamma$, we have $$\gamma \approx B\lambda, \quad (23)$$

$$B = [\sigma_1 \, \sigma_K \, \pi_2 \ldots \pi_{K-1}], \quad (24)$$

where the shelf filter and peak filter transfer function log magnitudes $\sigma(\omega; 1.0 \text{ dB}; \phi_k)$ and $\pi(\omega; 1.0 \text{ dB}; \phi_{k-1}, \phi_k)$ are evaluated using filter gains of 1.0 dB at frequencies $\omega_i$, and stacked to form the basis matrix B.

Therefore, given a set of shelf and peak filters having specified transition frequencies, and positive definite weighting matrix W, the gains $$\hat{\lambda} = (B^T W B)^{-1} B^T W \eta \quad (25)$$

will approximately minimize the weighted mean square difference between a desired dB magnitude response $\eta$ and the shelf and peak filter cascade dB magnitude at the set of frequencies $\omega_i$, $\gamma$.

In one embodiment of the inventive system, for a graphic equalizer with K−1 fixed band edges, the frequencies $\omega_i$ can be chosen as the K band centers, and the gains $\lambda$ simply computed as the control gains $\eta$ scaled by the basis inverse, $$\hat{\lambda} = B^{-1} \eta \quad (26)$$

Figure 5:
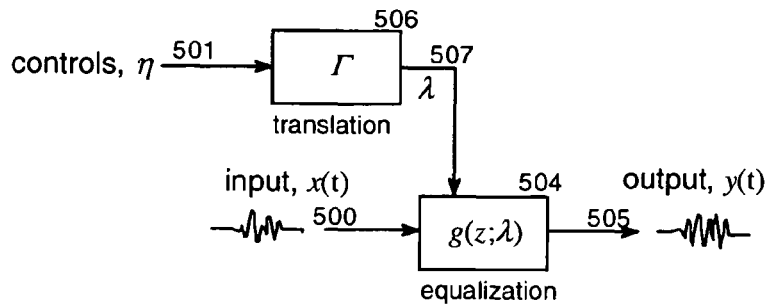
FIG. 5 illustrates an embodiment of the inventive system, in which input band gains are translated to band filter gains.

Accordingly, as shown in FIG. 5, controls $\eta$ 501 are used via (26) to produce filter gains $\lambda$ 507 in the peak and shelf filter cascade comprising 504.

Figure 6:
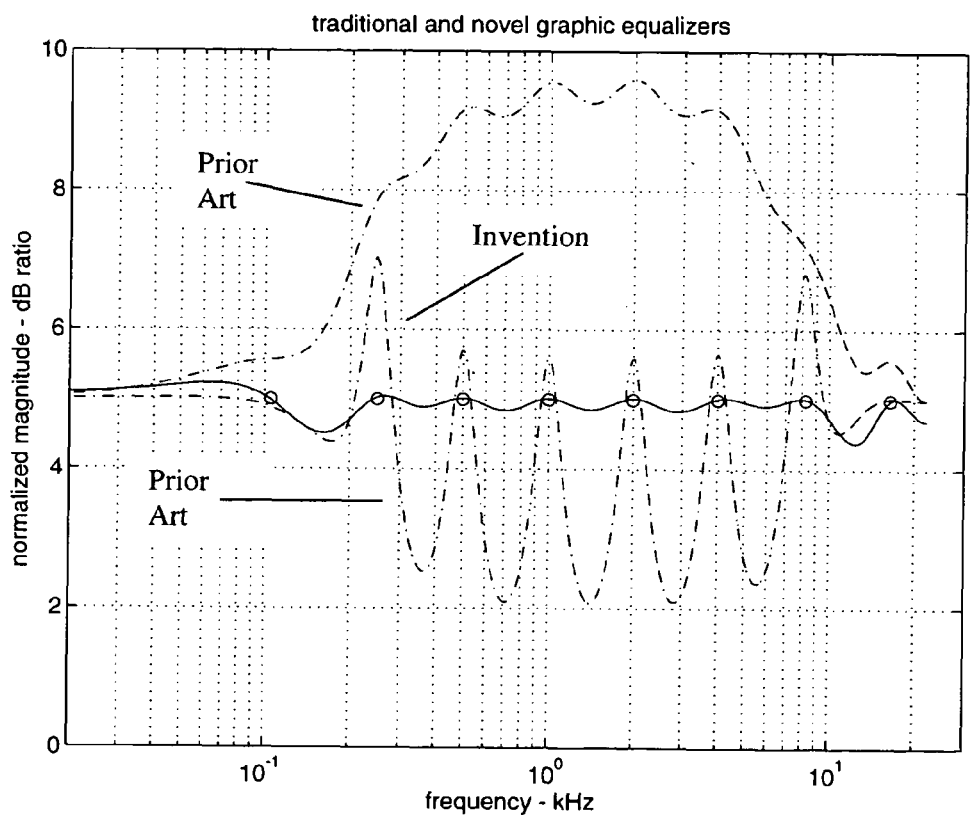
FIG. 6 is a graph illustrating a comparison between an example graphic equalizer transfer function of both inventive and prior art systems.
Figure 7:
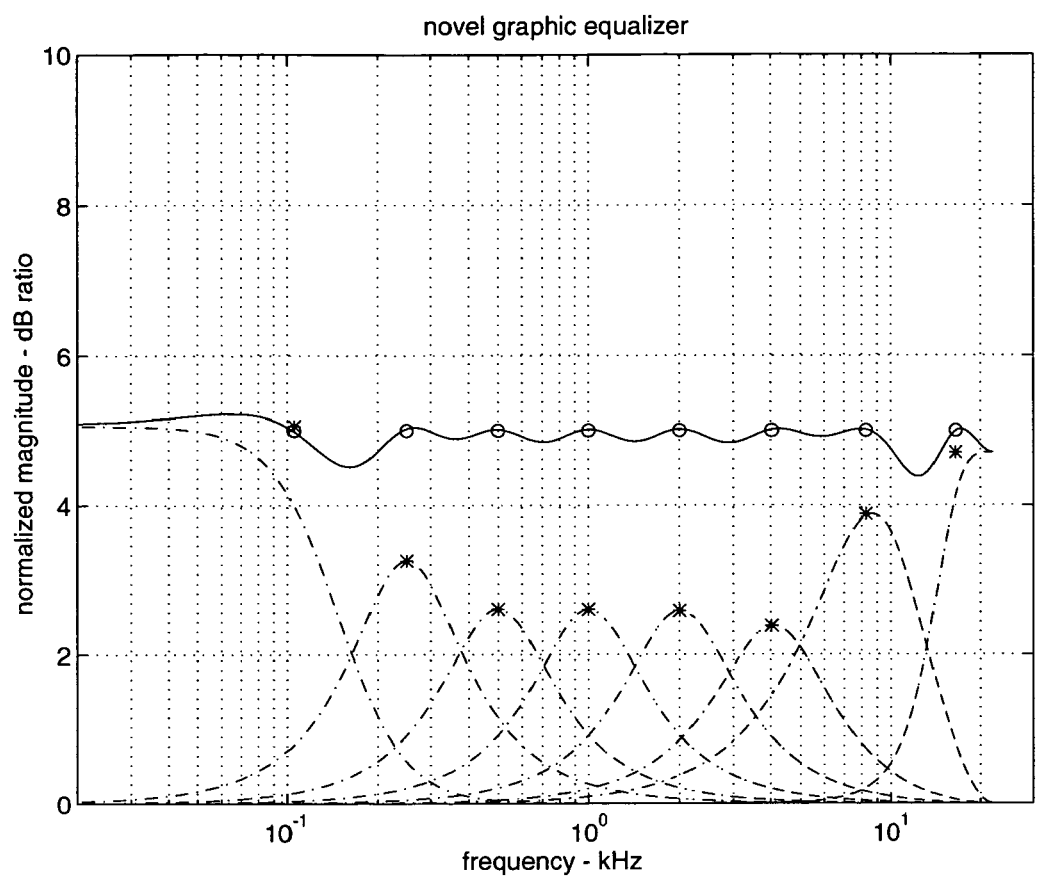
FIG. 7 is a graph illustrating an example of a graphic equalizer transfer function in accordance with the invention.
Figure 12:
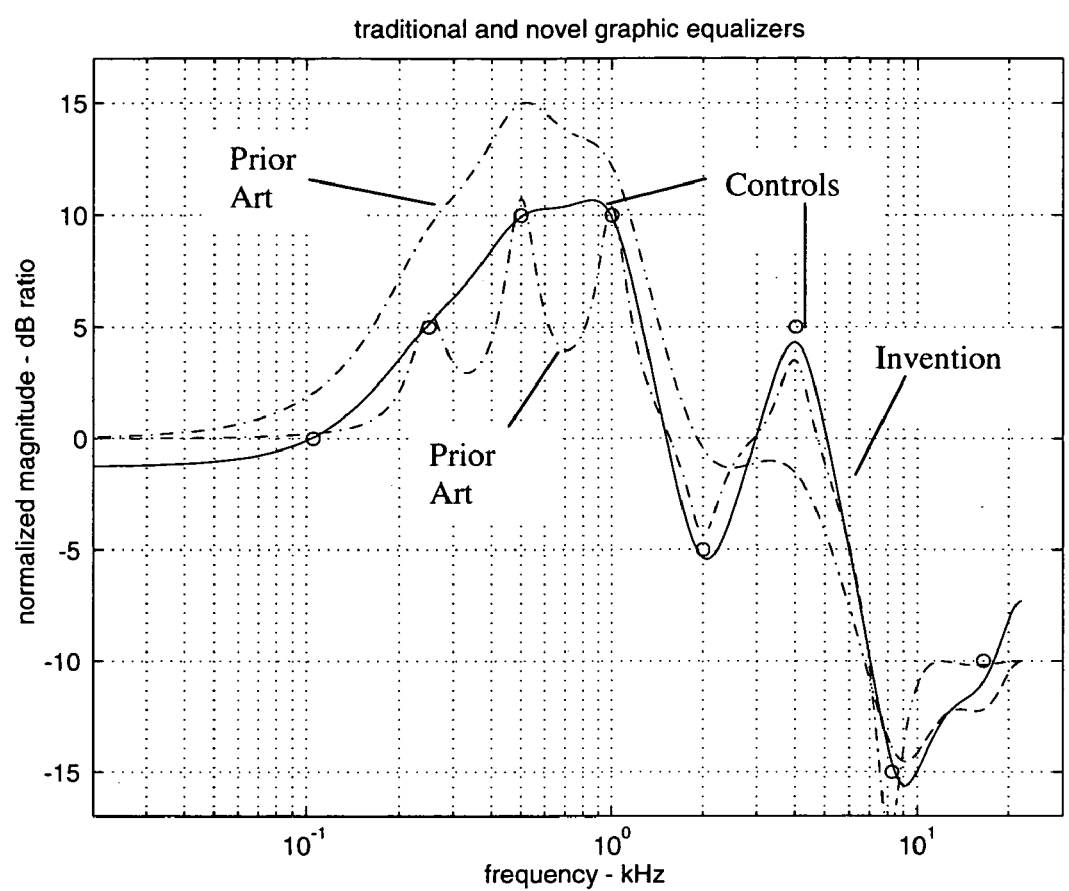
FIG. 12 is a graph illustrating a comparison between example inventive and prior art graphic equalizer transfer functions.

Such a gain computation was used to produce the equalizations shown in FIGS. 6 and 12, which are seen to smoothly interpolate the desired gains at the band center frequencies. Note that applying the desired gains directly to the same second-order filters (or to narrower-bandwidth filters) as is traditional results in a transfer function which is either excessively rippled or is not near the desired levels at the band center frequencies.

In one embodiment of the present invention, the band filters are made wider than their corresponding graphic equalizer transition frequencies, for example by a factor of 1.2. Doing so in conjunction with the traditional approach of using the band gains directly to design the band filters will result in a smooth equalizer magnitude, but with excessive overshoot. Computing the band gains according to (26) with such wide filters gives a smooth transfer function which still interpolates the bands.

Figure 16:
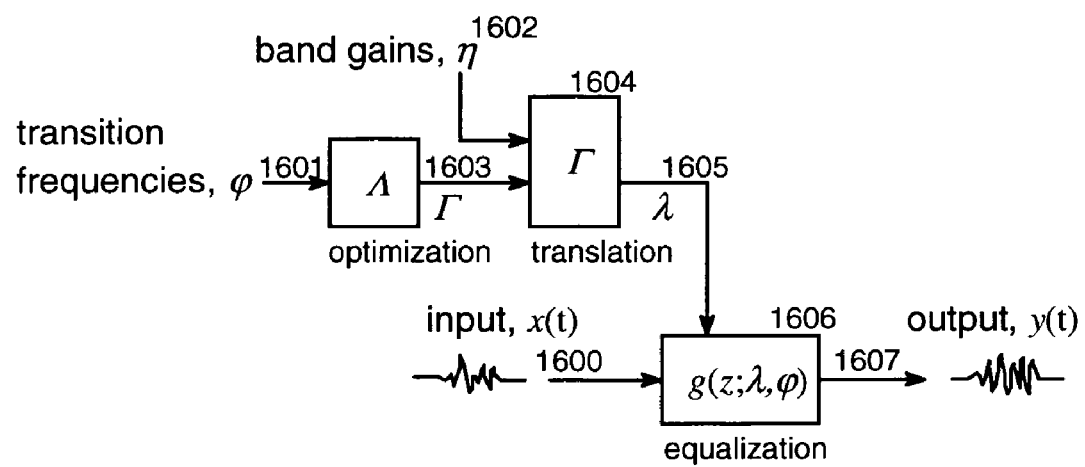
FIG. 16 illustrates another example graphic equalizer with a pre-computed gain translation matrix according to the invention.

Note that the basis inverse $B^{-1}$ depends only on the band filter transition frequencies 1601, and therefore may be pre-computed and provided to an optimization block, as shown in the alternative embodiment of FIG. 16.

Figure 13:
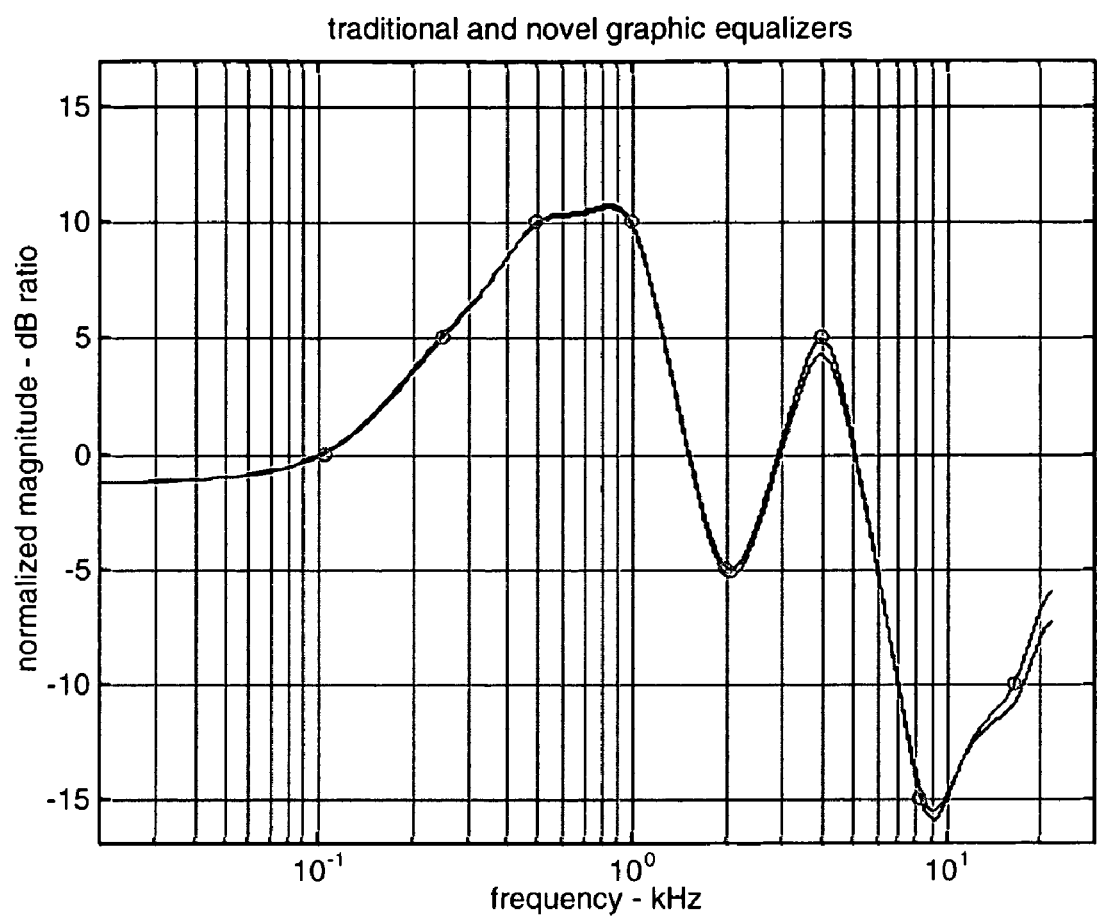
FIG. 13 is a graph illustrating transfer functions derived in accordance with the invention.

To account for any discrepancies in the self similarity property, (25) may be solved iteratively, forming B using the gains from the previous solution. The example of FIG. 13 shows the transfer function magnitude based on gains computed according to (25) with the basis B formed first using peaking and shelving filters with 1.0 dB gains and then using peaking and shelving filters with gains equal to the gains computed in the first iteration, $$\hat{\lambda}(i+1) = \hat{\lambda}(i) \odot B(\hat{\lambda}(i))^{-1} \eta \quad (27)$$

where the operator in (27) is an element-by-element product.

Figure 15:
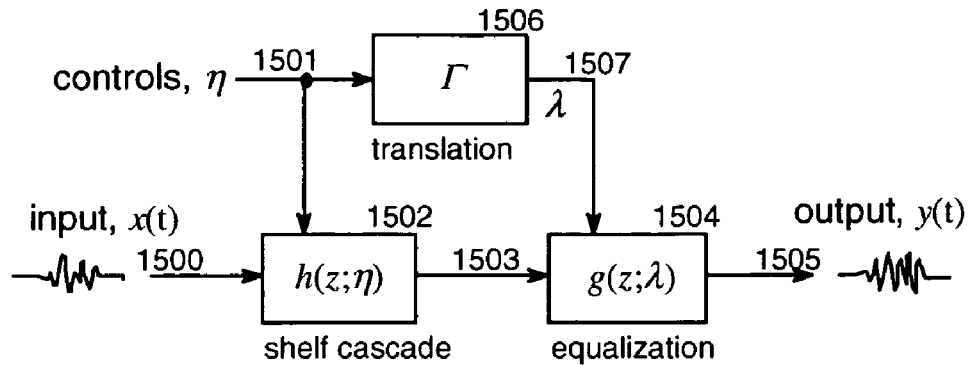
FIG. 15 illustrates an embodiment of the inventive system which includes filtering by a cascade of shelf filters.

In another embodiment of the present invention shown in FIG. 15, the input gains are used to form a cascade of shelf filters 1502 having transition frequencies given by the graphic equalizer transition frequencies. The first shelf filter has DC gain of $\eta_0$ and band edge gain of $\eta_1$, and the kth shelf filter has DC gain of zero dB and band edge dB gain of $\eta_{k+1} - \eta_k$. In this way, the shelf filter cascade will roughly follow the desired band gains. The remaining equalization section 1504 accounts for the dB difference between the desired transfer function and the shelf filter cascade.

The design method above can be extended to modeling of arbitrary transfer functions if coupled with a technique for determining the required number of filter sections, and a basis for fixing the transition frequencies of those sections.

To enable feature extraction from the transfer function to be modeled, critical-band smoothing can first be applied. See Julius O. Smith III, *Techniques for Digital Filter Design and System Identification with Application to the Violin*, Ph.D. thesis, Stanford University, 1983. If significant extrema of the smoothed magnitude transfer function are tabulated, transition frequencies for the shelf and peak filters can be computed as the geometric means of those extrema frequencies. Alternatively, the transition frequencies can be assigned at points where the smoothed magnitude transfer function has zeros in its second derivative, or points of inflection.

Once the transition frequencies are determined, the gains $\eta$ can be computed using (25). Here, however, a dense sampling of frequencies $\omega_i$ is suggested (for example, spaced according to a Bark or ERB frequency scale) to produce the desired dB magnitude $\gamma$ so as to ensure a good match across the entire audio band. The dimension of $\gamma$ will greatly exceed the number of filter sections, and we will have an overdetermined least-squares problem. Rather than the resulting transfer function magnitude interpolating the desired magnitudes at the sampled frequencies, the transfer function will approximate the desired magnitude, minimizing the mean square dB difference.

Figure 14:
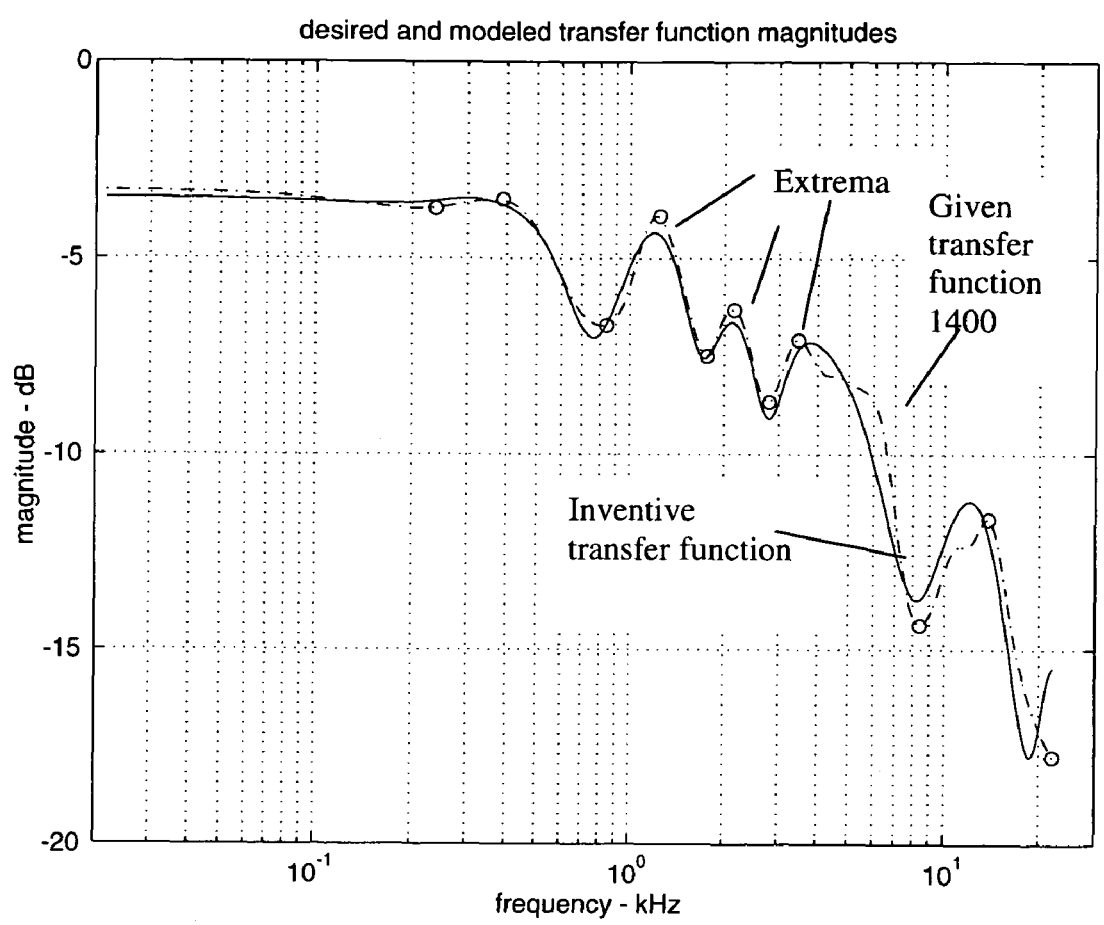
FIG. 14 is a graph showing an input transfer function as a dashed line, a set of extrema derived therefrom, shown as 'o' marks, and the transfer function of an inventive equalizer.
Figure 17:
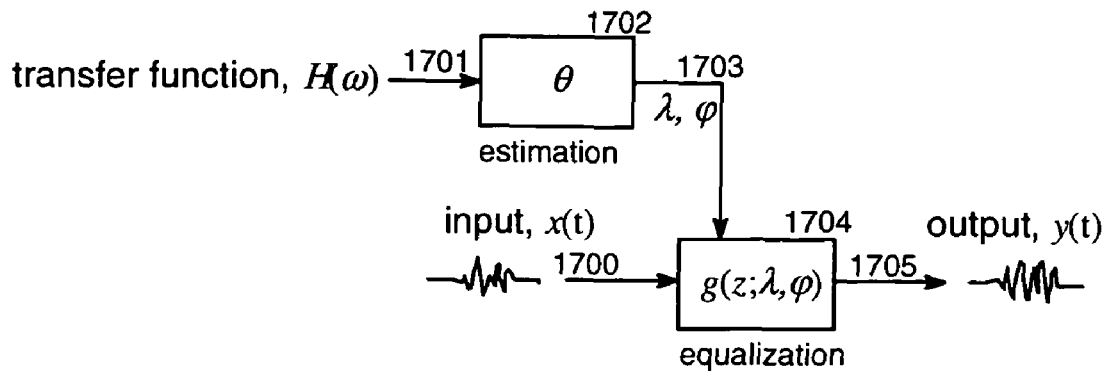
FIG. 17 illustrates another example equalizer according to the invention in which a transfer function is processed to develop band filter gains and transition frequencies.

This approach is illustrated in FIGS. 14 and 17. In FIG. 17, an input transfer function 1701 is analyzed to determine a set of frequency bands. The gains of equalizer 1704 are then fit to the input transfer function using (25), and used to form the equalizer 1704. FIG. 14 shows an input transfer function 1400, along with estimated significant extrema 1402, and an example inventive transfer function 1404.

Figure 18:
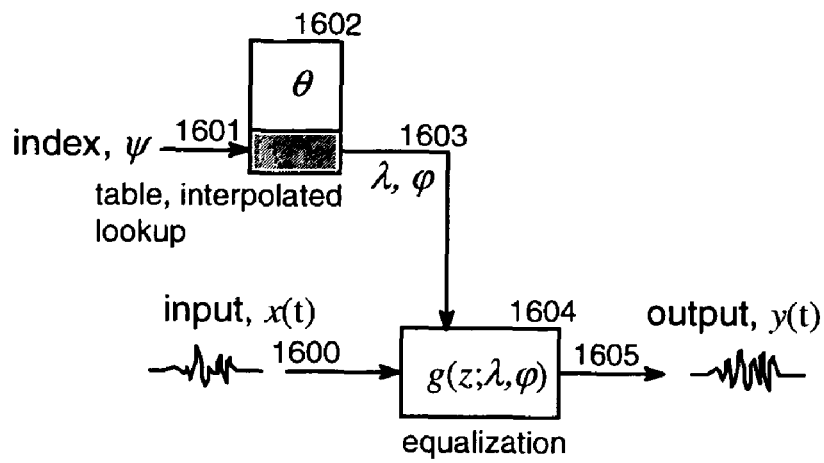
FIG. 18 illustrates an interactive equalizer according to another embodiment of the invention in which an input parameter is used to index a table of band filter gains and transition frequencies, derived according to the teachings of this invention.

In certain applications, it is desired to interpolate and slew among tabulated equalizations. In HRTF filtering, for example, a continuous direction of arrival indexes a set of filters tabulated at a discrete set of directions. FIG. 14 shows an HRTF with six major peaks and valleys in its magnitude transfer function. Plotted along with the HRTF is a fit based on the model described above. In terms of closeness-of-fit, this model requires a higher filter order than a warped Prony or Hankel norm method (see Julius O. Smith III, *Techniques for Digital Filter Design and System Identification with Application to the Violin*, Ph.D. thesis, Stanford University, 1983) to achieve the same quality, but the parametric representation given by this model allows interpolation between related HRTFs with ease—the transition frequencies and gains are simply crossfaded—while interpolation using Hankel, Prony, or similar methods is difficult, if not impossible. Such an arrangement resulting in a further embodiment of the invention is shown in FIG. 18, in which a parameter 1801 indexes tabulated transition frequencies and gains in 1802 to produce interpolated frequencies and gains of a set of band filters applied to an input signal.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method for equalizing a signal comprising:
accepting a set of frequency bands and a corresponding set of band gains;
processing the band gains to form filter gains for, and interference between, each of a plurality of infinite impulse response (IIR) filters, such that a combined gain comprising a sum of the filter gains of the plurality of IIR filters in all of the frequency bands due to the interference between filters in adjacent bands is approximately equal to the band gains.

2. A method according to claim 1, wherein the processing step includes:
forming a matrix which relates at least one of the filter gains to at least one of the band gains.

3. A method according to claim 2, wherein the matrix is precomputed.

4. A method according to claim 1, wherein the processing step includes anticipating equalization with a normalization filer, such that a further combined gain of the normalization filter and the combined gain of the plurality of filters approximate the set of band gains in the respective frequency bands.

5. A method according to claim 4, wherein the normalization filter is a cascade of shelf filters.

6. A method according to claim 5, wherein the shelf filters comprising the cascade of shelf filters are formed based on the frequency bands and band gains.

7. A method according to claim 1, wherein the combined gain is obtained by a cascade of the plurality of filters.

8. A method for equalizing a signal comprising:
accepting a transfer function magnitude;
accepting a set of frequency bands;
forming a set of band gains corresponding to the set of frequency bands;
processing the band gains to form filter gains for, and interference between, at least one of a plurality of infinite impulse response (IIR) filters, such that a combined transfer function magnitude comprising a sum of the filter gains of a cascade of the plurality of IIR filters due to the interference between filters in adjacent bands is approximately equal to the accepted transfer function magnitude.

9. A method according to claim 8, wherein the step of accepting the set of frequency bands comprises forming the set of frequency bands.

10. A method according to claim 8, wherein the processing step includes anticipating equalization with a normalization filter, wherein a further combined transfer function magnitude of the normalization filter and the cascade of the plurality of filters approximates the accepted transfer function magnitude.

11. A method for equalizing a signal according to at least one time-varying control, comprising:
forming a table of sets of filter gains corresponding to sets of respective frequency bands, the table being indexed by at least one of said time-varying controls, and wherein at least one set of filter gains and associated interference between filters is such that a sum of gains due to the interference between a cascade of a plurality of infinite impulse response (IIR) filters having said filter gains and said interference is approximately equal to a set of desired band gains in the respective frequency bands;
producing a set of interpolated filter gains in response to the time-varying control.

12. A method according to claim 1, wherein forming the interference includes determining respective transition frequencies for the plurality of IIR filters.

13. A method according to claim 8, wherein forming the interference includes determining respective transition frequencies for the plurality of IIR filters.

14. A method according to claim 11, further comprising determining respective transition frequencies for the plurality of IIR filters to obtain the interference.

* * * * *